Figure 1:
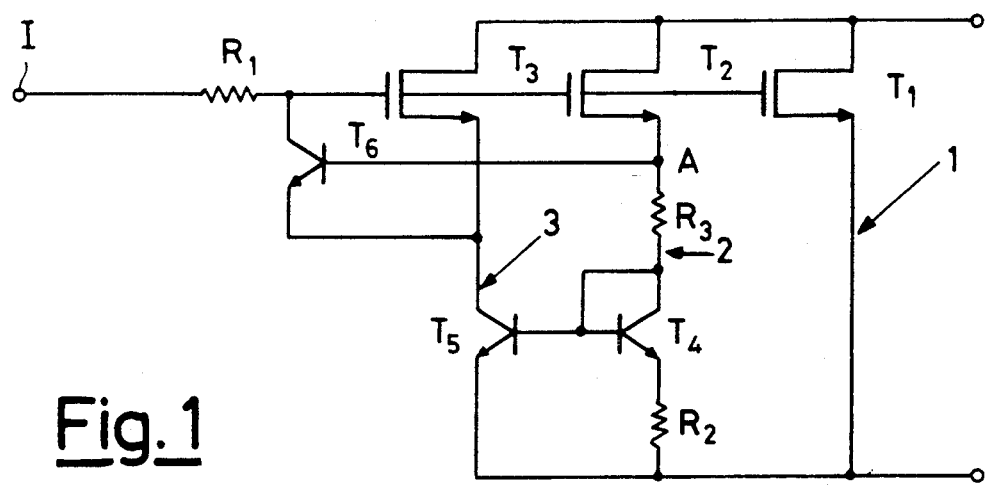

United States Patent [19]
Zisa et al.

[11] Patent Number: 5,177,659
[45] Date of Patent: Jan. 5, 1993

[54] DEVICE FOR PROTECTION AGAINST THE SHORT CIRCUIT OF AN MOS-TYPE POWER DEVICE, WITH A PRESET DEPENDANCE ON THE TEMPERATURE AT WHICH THE POWER DEVICE OPERATES

[75] Inventors: Michele Zisa, Comiso; Giuseppe Scilla, Catania; Sergio Palara, Acicastello, all of Italy

[73] Assignee: SGC-Thomson Microelectronics S.R.L., Milan, Italy

[21] Appl. No.: 605,449

[22] Filed: Oct. 30, 1990

[30] Foreign Application Priority Data

Nov. 17, 1989 [EP] European Pat. Off. ........ 89830500.8

[51] Int. Cl.$^5$ ...................... H03K 17/08; H03K 17/14
[52] U.S. Cl. ........................................ 361/103; 361/93
[58] Field of Search ................. 361/103, 106, 91, 56; 330/207 P

[56] References Cited

U.S. PATENT DOCUMENTS 3,845,405 10/1974 Leidich ............................ 330/207 P

FOREIGN PATENT DOCUMENTS 3821065  6/1989  Fed. Rep. of Germany .
8002672  2/1980  France .
6084009 10/1983  Japan .

Primary Examiner—A. D. Pellinen
Assistant Examiner—S. Jackson

[57] ABSTRACT

The device for protection against the short circuit of an MOS-type power device comprises at least one secondary branch cirucit arranged in parallel with a main branch circuit which includes the power transistor. The secondary branch includes a control MOS transistor having the same characteristics as the power transistor under control and the ability to conduct a current equal to a fraction of that flowing through the power transistor. The gate of the control transistor is connected directly with that of the power transistor. The secondary branch also includes means sensitive to temperature which, in the case of a current flow corresponding to the short circuit current of the power transistor, act on the gate common to the control and to the power transistors so as to lower its voltage and thus limit the conduction of same.

1 Claim, 2 Drawing Sheets

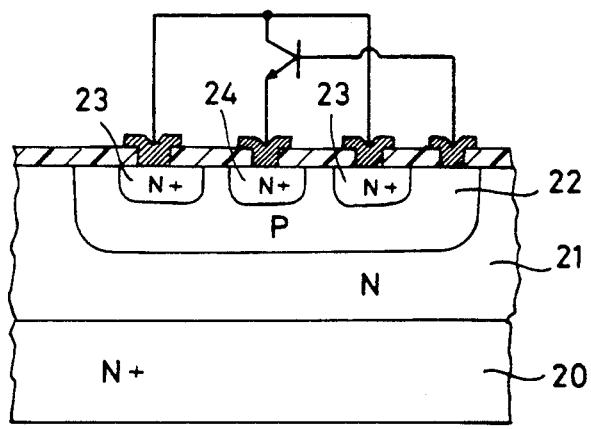
Fig.4
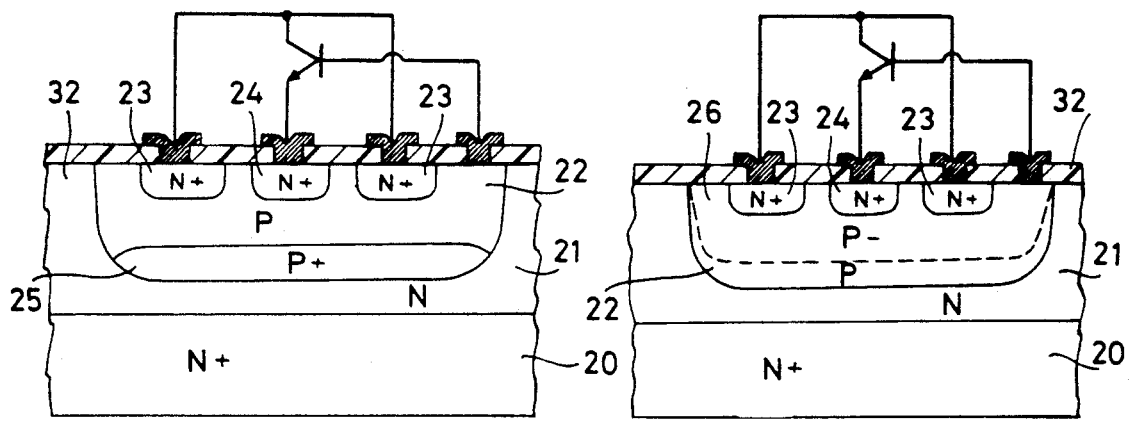
Fig.5
Fig.6
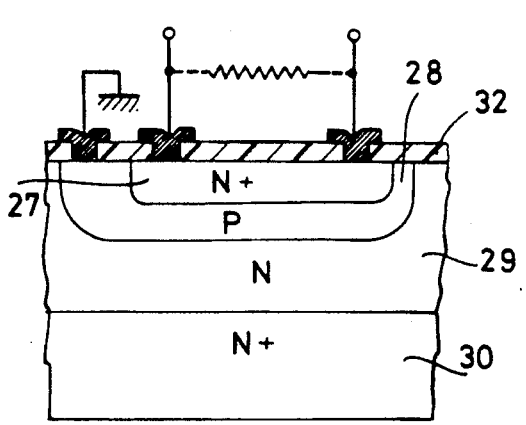
Fig.7
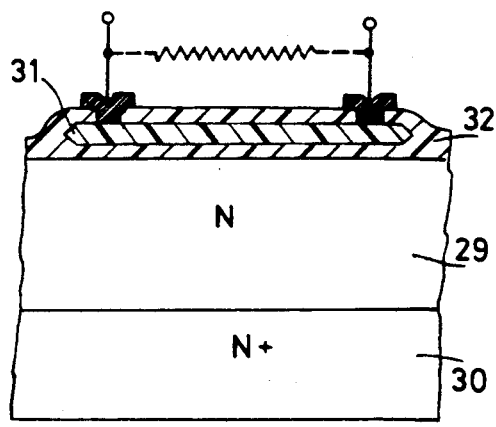
Fig.8

DEVICE FOR PROTECTION AGAINST THE SHORT CIRCUIT OF AN MOS-TYPE POWER DEVICE, WITH A PRESET DEPENDANCE ON THE TEMPERATURE AT WHICH THE POWER DEVICE OPERATES

DESCRIPTION

The present invention relates to a device for protection against the short circuit of an MOS-type power device, with a preset dependance on the temperature at which the power device operates.

The accomplishment of a protection against the short circuit of an MOS-type power device, integrated in the same chip and using only the technology of such power devices, is a requirement which is quite widespread in the market.

The devices for protection against the short circuit currently available on the market depend substantially on temperature. Such a dependance limits the ability to supply current on the part of the power device, even though it may be considered useful for reasons of thermal protection.

The object of the present invention is to accomplish a device for protection against the short circuit of an MOS-type power device, wherein the limiting current is a preset function of temperature.

A further object is to accomplish the protection device in integrated technology together with the MOS power device without using any processing stage over in addition to those required for the accomplishment of the standard power device.

According to the invention such object is attained with a device for protection against the short circuit of an MOS-type power device, characterized in that it comprises at least one secondary circuit branch arranged in parallel with a main circuit branch including the power transistor, said secondary branch including an MOS control transistor having the same branch including an MOS control transistor having the same characteristics as the power transistor under control and an ability to conduct a current equal to a fraction of that which flows through the power transistor and having its gate connected directly with that of the power transistor, said secondary branch including also means sensitive to temperature which, in the case of a current flow corresponding to the short circuit current of the power transistor, act on the gate common to the control and to the power transistors so as to lower its voltage and thus limit the conduction of same.

The characteristics of the present invention shall be made more evident by an embodiment illustrated as a example in the enclosed drawings wherein:

FIG. 1 illustrates a circuital accomplishment of the unit consisting of the power device and of the protection device according to the invention;

FIGS. from 2 to 8 show possible embodiments in integrated technology of the power MOS device and of the components of the protection device.

The circuit shown in FIG. 1 consists essentially of a main branch 1 including a power MOS transistor T1 and two parallel secondary branches 2 and 3 including respective control MOS transistors T2 and T3 having the same characteristics as the power transistor and an ability to conduct a current equal to a fraction (say, one thousandth) of that of the power transistor. The gate and the drain of the power MOS transistor T1 are connected with the gates and with the drains of the control MOS transistors T2, T3. The source of transistor T2 is connected with the base of the NPN bipolar transistor T6 and, by means of resistance R3, with the collector of an NPN bipolar transistor T4. The emitter of transistor T4 is connected by means of a resistance R2 with the source of transistor T1 and with the emitter of an NPN bipolar transistor T5. The base of transistor T4 is connected directly with the corresponding collector and with the base of transistor T5. The collector of transistor T5 is connected with the source of transistor T3 and with the emitter of transistor T6. The collector of transistor T6 is connected with the gate of transistor T3 and, by means of a resistance R1, with a signal input I.

Figure 2:
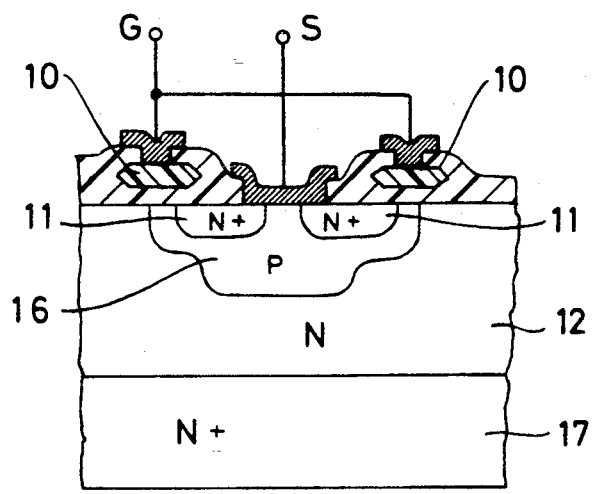

FIG. 2 shows a possible embodiment, in integrated technology, of the power MOS transistor T1, whose gate G is accomplished at strips of polysilicon 10, while the source S is accomplished at regions 11 of type N+ which are in turn obtained inside a body region 16 of type P, set on an epitaxial stratum 12 of type N, in its turn obtained on a substratum 17 of type N+, which also constitutes the drain of transistor T1.

Figure 3:
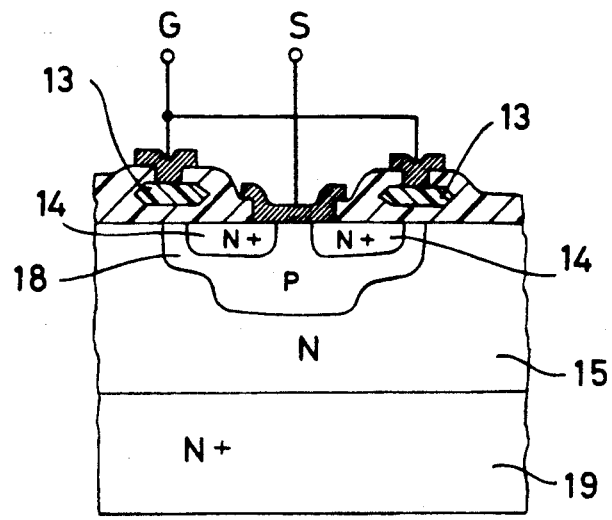

FIG. 3 shows a possible embodiment, in vertical DMOS integrated technology, of the control MOS transistors T2, T3, whose gate G is accomplished at strips of polysilicon 13, while source S is accomplished at regions 14 of type N+ which are in turn obtained inside a body region 18 of type P set on an epitaxial stratum 15 of type N in its turn obtained on a substratum 19 of type N+ which also constitutes the drain of transistors T2, T3.

FIGS. 4, 5, 6 illustrate different embodiments in integrated technology of the bipolar transistors T4, T5, T6.

As illustrated in FIG. 4, on a substratum 20 of type N+ there is set an epitaxial stratum 21 of type N, on which there is obtained a body region 22 of type P which forms the base of the single transistor T4, T5, T6, whose collector is obtained in regions 23 of type N+ and whose emitter is obtained in a region 24 of type N+, regions 23 and 24 being obtained at the summit of body region 22.

The characteristics of the single transistor T4, T5, T6 are improvable by adding a type P+ masking and by enriching region 22 during the process stage. As shown in FIG. 5, there is thus formed a further region 25 of type P+ in the proximity of the bottom of region 22.

As an alternative, with reference to FIG. 6, it is possible to execute a further phosphorus masking operation with the object of creating a further region 26 of type P− inside region 22 of type P.

With reference to FIG. 7, an embodiment in integrated technology of resistances R1, R2, R3 provides for the formation of a region 27 of type N+ accomplished with an arsenic diffusion inside a body region 28 of type P connected to ground. Such region 28 is obtained on an epitaxial stratum 29 of type N in turn superimposed on a substratum 30 of type N+.

With reference to FIG. 8, such resistances R1, R2, R3 may also be accomplished by means of a stratum of polysilicon 31 included in superficial oxide 32.

From FIGS. 2-8 it is possible to observe that all the components of the protection device (circuit branches 2 and 3 of FIG. 1 with the addition of transistor T6 and of resistance R1) may be accomplished on the same chip as power device T1 without adding any process stages, except of course for those providing improvements of FIGS. 5 and 6.

Before going on to the description of the operation of the circuit illustrated in FIG. 1 it is necessary to make some considerations on the size of the components which have been introduced into the protection device.

A first consideration refers to the fact that the area of transistor T4 is greater than that of transistor T5, so that the current supplied by transistor T4 is normally greater than that supplied by transistor T5.

A further consideration refers to the fact that resistance R2 has been dimensioned so as to cause across its terminals a voltage drop such as to equal the currents flowing through T4, T5 should the current supplied by transistor T2 reach a threshold value above which the triggering of the protection device is required.

With reference to FIG. 1, the circuit operates as follows.

Under normal operating conditions, control transistors T2 and T3 are passed through by currents equal to a fraction (say, one thousandth) of that of power transistor T1 and the voltage drop across R2 is such that the current mirrored by T5 is lower than that mirrored by T4, in turn forced by T2. Under these conditions the point A, the base of transistor T6, is at a voltage high. T3, being a current generator accomplished in the same manner as T2, attempts to supply the same current as T2 and thus the collector of T5 is at a voltage high (roughly the drain voltage of T3, T2, T1). Under this condition T6 cannot conduct since the voltage between base and emitter is negative, since the voltage of the emitter of T6 is roughly equal to the drain voltage of transistor T1 and the voltage at the base of T6 is equal to the voltage at point A. There is thus no limitation of current.

Once the current of T2 has reached the threshold value above which it is required to trigger the protection device, that is in the presence of a potential short circuit condition of the power transistor T1, there is a voltage drop across the terminals of resistance R2 which gives the result of equalling the currents flowing through T4, T5. The collector of transistor T5 which is forced to conduct the same current supplied by T3, since I(T3)=I(T2) is always true, and which coincides with the emitter of T6, is lowered in voltage and, as soon as the voltage drop across R2 rises a little more, T6 enters into conduction and accomplishes the protection.

With this circuit it is possible to accomplish a constant temperature protection (or at least with a very low variation less than 9%). It is thus seen that the mechanism triggering the protection is the difference of Vbe between T5 and T4 which, as is well known, has a positive coefficient of variation with temperature.

If the dependance of such difference of Vbe with temperature were to be equal to the dependance of R2 with temperature, there would be a protection against short circuits which is independent of temperature, that is constant with temperature.

Thus if a resistance is used which has a positive coefficient of variation with temperature an attempt may be made to obtain the same coefficient of variation of the difference of Vbe.

The following are some examples of numerical accomplishments of the circuit.

Suppose that the current on the power MOS transistor (T1) is to be limited to 2.75 A.

If is we suppose that the area of T2, T3 is one thousandth of the area of T1, the current flowing on T2, T3 will always be equal to roughly one thousandth of that flowing on T1.

The example which follows refers to a limitation to 25° C.

Suppose that the ratio between the areas of T4, T5 is 2/1 (this ratio may be chosen at will so that the value of resistance R2 be the most convenient).

The difference of Vbe for this ratio (T4/T5=2) so that the currents in transistors T4 and T5 are balanced is $$\text{diff.}Vbe = (KT)/q \times \lg[A(T5)/A(T4)] \times [I(T4)/I(T5)] = 18 \times 10^{-3} V$$

where
K = Boltzman's constant
q = electron charge
A(T5) = area of emitter T5
A(T4) = area of emitter T4
I(T4) = current of T4 collector
I(T5) = current of T5 collector
then $$R2 = \text{diff.}Vbe/IL2 = 18 \times 10^{-3} V/2.75 \times 10^{-3} VA = 6.540 \text{ ohms}$$

where IL2 is the limitation current of T2.

R3 is dimensioned so as to ensure across its terminals a voltage drop of about 100 mV, so as to ensure a certain dynamic for T5, R3 = 100 Mv/2.75 mA = 36.36 ohm, and it may be accomplished in polysilicon.

The size of T6 and R1 may be selected so as to ensure proper operation for a certain current at circuit input I.

Considering that the coefficient of variation of the difference of Vbe with temperature, with an areas ratio of 10 is 0.2 mV/°C., for a ratio of 2 we will have (0.2 mV×lg 2)/lg 10=0.06 mV/°C.

Moreover if R2 is accomplished in aluminium, by means of a path similar to that which connects the different elements of the integrated circuit according to the known art, it will have a coefficient of variation with temperature equal to 4500 ppm/°C.

Suppose that it is required to bring the device to operate at a temperature of 150° C.

At this temperature the difference of Vbe to balance the currents of T5 and T4 shall be 25.5 mV, R2 shall be equal to 10.21, IL1=IL2×1000=2.5 mA IL1 is T1's current of limitation.

There is thus accomplished a variation of only 9% in the current of limitation against a variation of 125° C. in temperature.

Suppose that it is required to obtain a protection device to have a present dependance on temperature.

This is possible by replacing resistance R2, accomplished in the previous case in aluminium, with, say, resistances in polysilicon or resistances accomplished by the diffusion of arsenic of type N+, which, having different coefficients of thermal variation, shall ensure different dependencies on temperature.

In particular, since a resistance accomplished with a diffusion of arsenic of type N+ has a coefficient of variation with temperature of about 1500 ppm/°C. (against the 4500 ppm/°C. of the aluminium resistance), R2, with the same circuit configuration of the previous case, would go from 6.54 ohms to 7.76 ohms.

At the same time the difference of Vbe, as has already been seen, goes from 18 mV to 25.5 mV, again for a temperature variation from 25° C. to 150° C.

In this case IL1=25.5/7.76=3.28 A.

We will thus, in this case, have a current which increases with temperature.

Similarly, if R2 is accomplished in polysilicon, since the coefficient of variation for silicon is actually negative, there will be an increase in the current of limitation as the temperature rises which is even more pronounced than in the previous case (resistance accomplished by the diffusion of arsenic of type N+).

We claim:

1. Device for protection against the short circuit of an MOS-type power device, characterized in that it comprises at least one secondary circuit branch arranged in parallel with a main circuit branch including the power transistor, said secondary branch including an MOS control transistor having the same characteristics as the power transistor under control and an ability to conduct a current equal to a fraction of that which flows through the power transistor and having its gate connected directly with that of the power transistor, said secondary branch including also means sensitive to temperature which, in the case of a current flow corresponding to the short circuit current of the power transistor, act on the gate common to the control and to the power transistor so as to lower its voltage and thus limit the conduction of same, wherein said at least one secondary branch is constituted by a first branch including a first control transistor and a second branch including a second control transistor, and said means comprise a first bipolar transistor inserted in the first secondary branch and a second bipolar transistor inserted in the second secondary branch, said first transistor having an area which is greater than that of said second transistor so that a current normally flows through it which is greater than that flowing through the latter, said means comprising in addition a resistance connected between said first bipolar transistor and the source of said power transistor and dimensioned so that the flow of a current corresponding to the short circuit current through the power transistor causes a voltage drop across it so as to force equal currents through said first and second transistors, said means comprising lastly a third bipolar transistor connected between the common gate of said MOS transistors and the second bipolar transistor and with its base connected with a point of said first secondary branch set between said first control transistor and said first bipolar transistor so as to lower the gate voltage of the MOS transistors when said voltage drop is established across said resistance R2 as a consequence of a short circuit current in the power transistor.

* * * * *

UNITED STATES PATENT AND TRADEMARK OFFICE
CERTIFICATE OF CORRECTION

PATENT NO. : 5,177,659
DATED : January 5, 1993
INVENTOR(S) : Michele Zisa, Giuseppe Scilla, Sergio Palara It is certified that error appears in the above-identified patent and that said Letters Patent is hereby corrected as shown below:

On the title page, item (73):

Delete "SGC" and substitute therefor -- SGS --

After "S.R.L.," insert -- AGRATE BRIANZA, --

Please add after the first assignee, the following additional assignee:

-- CONSORZIO PER LA RICERCA SULLA
       MICROELETTRONICA NEL MEZZOGIORNO
       CATANIA, ITALY --

Signed and Sealed this

First Day of February, 1994

*Attest:*

BRUCE LEHMAN

*Attesting Officer*     *Commissioner of Patents and Trademarks*